(12) United States Patent
Lee et al.

(10) Patent No.: US 8,586,962 B2
(45) Date of Patent: Nov. 19, 2013

(54) CROSS POINT MEMORY ARRAYS, METHODS OF MANUFACTURING THE SAME, MASTERS FOR IMPRINT PROCESSES, AND METHODS OF MANUFACTURING MASTERS

(75) Inventors: Byung-kyu Lee, Seoul (KR); Du-hyun Lee, Suwon-si (KR); Myoung-jae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 68 days.

(21) Appl. No.: 13/338,902

(22) Filed: Dec. 28, 2011

(65) Prior Publication Data
US 2012/0104353 A1 May 3, 2012

Related U.S. Application Data

(62) Division of application No. 12/588,107, filed on Oct. 5, 2009, now Pat. No. 8,105,884.

(30) Foreign Application Priority Data

Oct. 6, 2008 (KR) .................. 10-2008-0097788
Nov. 10, 2008 (KR) .................. 10-2008-0111218
Feb. 13, 2009 (KR) .................. 10-2009-0012118

(51) Int. Cl.
*H01L 47/00* (2006.01)
(52) U.S. Cl.
USPC ......... 257/5; 257/536; 257/537; 257/E47.001
(58) Field of Classification Search
USPC .................. 257/4–5, 536–538, E47.001
See application file for complete search history.

(56) References Cited

U.S. PATENT DOCUMENTS

| 6,429,449 | B1 | 8/2002 | Gonzalez et al. |
| 6,566,700 | B2 * | 5/2003 | Xu .................. 257/296 |
| 6,586,761 | B2 * | 7/2003 | Lowrey ............... 257/3 |
| 7,291,878 | B2 | 11/2007 | Stipe |
| 7,309,630 | B2 | 12/2007 | Fan et al. |
| 7,330,369 | B2 | 2/2008 | Tran |
| 7,341,892 | B2 | 3/2008 | Matsuoka et al. |
| 7,427,536 | B2 | 9/2008 | Forbes et al. |
| 7,701,750 | B2 | 4/2010 | Shih et al. |
| 7,745,312 | B2 | 6/2010 | Herner et al. |
| 7,923,285 | B2 | 4/2011 | Lai et al. |
| 7,927,977 | B2 | 4/2011 | Makala et al. |
| 7,972,895 | B2 | 7/2011 | Lung |
| 2007/0010054 | A1 * | 1/2007 | Fan et al. ............ 438/257 |

FOREIGN PATENT DOCUMENTS

| KR | 10-2003-0003106 | 1/2003 |
| KR | 10-2005-0013209 | 2/2005 |
| KR | 10-2206-0131666 | 12/2006 |

OTHER PUBLICATIONS

Notice of Allowance dated Sep. 28, 2011 for U.S. Appl. No. 12/588,107.

* cited by examiner

*Primary Examiner* — Thanh Nguyen
(74) *Attorney, Agent, or Firm* — Harness, Dickey & Pierce, P.L.C.

(57) ABSTRACT

A cross point memory array includes a structure in which holes are formed in an insulating layer and a storage node is formed in each of the holes. The storage node may include a memory resistor and a switching structure. The master for an imprint process used to form the cross-point memory array includes various pattern shapes, and the method of manufacturing the master uses various etching methods.

6 Claims, 14 Drawing Sheets

CROSS POINT MEMORY ARRAYS, METHODS OF MANUFACTURING THE SAME, MASTERS FOR IMPRINT PROCESSES, AND METHODS OF MANUFACTURING MASTERS

CROSS-REFERENCE TO RELATED APPLICATIONS

This application is a Divisional of U.S. application Ser. No. 12/588,107, filed on Oct. 5, 2009 now U.S. Pat. No. 8,105,884, which claims priority to Korean Patent Application No. 10-2008-0097788, filed on Oct. 6, 2008, Korean Patent Application No. 10-2008-0111218, filed on Nov. 10, 2008, and Korean Patent Application No. 10-2009-0012118, filed on Feb. 13, 2009, in the Korean Intellectual Property Office, the entire contents of each of these applications are incorporated herein by reference.

BACKGROUND

1. Field

One or more example embodiments relate to cross point memory arrays, methods of manufacturing the same, masters for imprint processes, and methods of manufacturing masters. More particularly, one or more example embodiments relate to cross point memory arrays including a variable resistance material as a storage node, methods of manufacturing the same,' masters for imprint processes, which are used to manufacture cross point memory arrays, and methods of manufacturing masters.

2. Description of the Related Art

Conventional semiconductor memory arrays include a plurality of unit memory cells. An example of a volatile semiconductor memory is a dynamic random access memory (DRAM). In a conventional DRAM, each unit memory cell includes a switch and a capacitor. Conventional DRAMs are relatively highly integrated and have relatively fast operating speeds. But, DRAMs are volatile in that after power to the DRAM is turned off, all data stored in the DRAM is lost.

A conventional flash memory, on the other hand, is an example of a non-volatile memory device. In a conventional flash memory device all data stored in the non-volatile memory device is retained even after power to the non-volatile memory device is turned off. Conventional flash memories have non-volatile properties, but have lower integration degree and slower operating speeds as compared to conventional DRAMs.

At present, non-volatile memory devices, such as magnetic random access memory (MRAM), ferroelectric random access memory (FRAM), phase-change random access memory (PRAM), and resistance random access memory (RRAM) are being studied. In one example, to store data a RRAM uses a variable resistance property of a transition metal oxide material, for example, a property in which the resistance of the transition metal oxide material varies according to the state of the RRAM.

RRAMs have been studied based on a cross point array structure in which a plurality of lower electrodes and a plurality of upper electrodes cross one another. A storage node is formed at each point in which the plurality of lower electrodes and the plurality of upper electrodes cross one another. Random access is possible in the cross point array structure, and thus, data reading and writing may be performed more easily. However, when reading and writing data, a current path is formed between the cross point array structure and a storage node that is adjacent to the cross point array structure, thereby resulting in a leakage current. To reduce the leakage current in the cross point array structure, a switching structure is formed together with the storage node.

Various technologies for transferring semiconductor patterns to manufacture a semiconductor device, such as a resistive memory device, have been developed. The technology that is mostly used for transferring semiconductor patterns is photolithography such as electron beam (E-beam) lithography technology and X-ray exposure technology using radiation light. These types of photolithography are used to manufacture a mask for photolithography and to form fine patterns. In these technologies, as semiconductor patterns become more precise, the cost for manufacturing a semiconductor device increases. In addition, in E-beam lithography photolithography, patterns have a two-dimensional (2D) structure in which the shape of patterns formed in an exposed region and the shape of patterns formed in an unexposed region are relatively simple. Thus, there is a limitation in forming various patterns.

Nano-imprint lithography (NIL) has been found to be a relatively effective and relatively economical alternative technology for forming patterns. NIL is a technology suggested for performing a nano-process (e.g., about 1 nm to about 100 nm, inclusive) as an ultra-fine process. In NIL, mold patterns are directly transferred onto a substrate by using a press method. A thermoplastic resin or a photocurable resin is coated on the substrate, pressurized with a nano-sized mold by using heat or ultraviolet (UV) rays, and cured to transfer the mold patterns. By using NIL, a stepped portion may be formed more conveniently on a substrate to be processed. A general photolithography process is finished with a one press transferring process, and thus, NIL is more effective for forming a multi-stepped shape. It has also been reported that NIL may be used in a process of manufacturing an electronic device such as a metal oxide semiconductor field effect transistor (MOSFET) or an optical device, instead of the general photolithography process.

SUMMARY

One or more example embodiments provide cross point memory arrays and methods of manufacturing the same.

One or more example embodiments also provide masters for imprint processes, in which various patterns are formed, and methods of manufacturing the same.

According to at least one example embodiment, a cross point memory array includes a plurality of bottom electrodes formed on a substrate to be parallel with one another, and a plurality of top electrodes formed to be parallel with one another and to cross the bottom electrodes. The cross point memory array further includes an insulating layer interposed between the bottom electrodes and the top electrodes. The insulating layer includes a hole formed at each point where the bottom electrodes and the top electrodes cross one another. Each hole exposes a portion of a surface of a bottom electrode. Still further, the cross point memory array includes a storage node formed in each hole. The storage node includes a memory resistor, an intermediate electrode layer, and a switching structure formed sequentially in each hole. The memory resistor is formed on a bottom and a sidewall of each of the holes.

According to at least some example embodiments, the memory resistor may be a material having two or more resistances according to the size of an applied pulse voltage. The memory resistor may be formed of a transition metal oxide material. For example, a transition metal oxide material may include nitrogen (Ni) oxide, titanium (Ti) oxide, hafnium (Hf)

oxide, zirconium (Zr) oxide, zinc (Zn) oxide, tungsten (W) oxide, cobalt (Co) oxide, copper (Cu) oxide, niobium (Nb) oxide, or a material including at least one selected from the group including: Ni oxide, Ti oxide, Hf oxide, Zr oxide, Zn oxide, W oxide, Co oxide, Cu oxide, and Nb oxide. The switch structure may include a diode having an n-type oxide semiconductor layer and a p-type oxide semiconductor layer.

At least one other example embodiment provides a method of manufacturing a cross point memory array. According to at least this example embodiment, a plurality of bottom electrodes are formed on a substrate to be parallel with one another, and an insulating layer is formed on the bottom electrodes. A plurality of holes are formed in the insulating layer at positions corresponding to the bottom electrodes by performing a nano-imprint process. A storage node is formed on a bottom and a sidewall of each of the holes, and a plurality of top electrodes are formed to be parallel with one another at positions corresponding to the holes.

At least one other example embodiment provides a master for an imprint process. According to at least this example embodiment, the master includes a first type pattern and a second type pattern. The first type pattern and the second type pattern may have different shapes.

According to at least some example embodiments, the first type pattern and the second type pattern may include at least one pattern selected from the group including an inclination pattern, a vertical pattern, and a rounded pattern. The master may include a multi-layered structure, and the first type pattern and the second type pattern may be formed in different layers. The widths of the first type pattern and the second type pattern may be different. The master may include a first layer, a second layer, and a third layer. The second layer and the third layer may be formed sequentially on the first layer, and the first type pattern is formed in the third layer. The second type pattern is formed in the second layer. The width of the second type pattern may be less than that of the first type pattern. The second layer may include silicon oxide or silicon nitride, and the third layer may include silicon.

At least one other example embodiment provides a method of manufacturing a master for an imprint process. According to at least this example embodiment, a substrate is prepared and a mask layer is formed such that a portion of a surface of the substrate is exposed through the mask layer. A first etching process is performed to form a first type pattern in the exposed surface of the substrate, and a second etching process is performed to form a second type pattern in the substrate.

According to at least some example embodiments, the first etching process and/or the second etching process may include at least one process selected from the group including a dry etching process and a wet etching process. For example, the first etching process may be a wet etching process, and the first type pattern may be an inclination pattern. The surface of the substrate may include Si (100), and the wet etching process may be an etching process using a potassium hydroxide (KOH) or teramethylammonium hydroxide (TMAH) solution.

According to at least some example embodiments, the first etching process may be a dry etching process, and the first type pattern may be a vertical pattern. The surface of the substrate may include Si (100), and the dry etching process may be an etching process using, for example, $Cl_2$, $CF_4$, or $CF_4/O_2$ gas.

According to at least some example embodiments, the first etching process may be a wet etching process, and the first type pattern may be a rounded pattern. The surface of the substrate may include Si, and the wet etching process may be an etching process using, for example, $HF/HNO_3/H_2O$ or $HF/HNO_3/CH_3COOH$.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
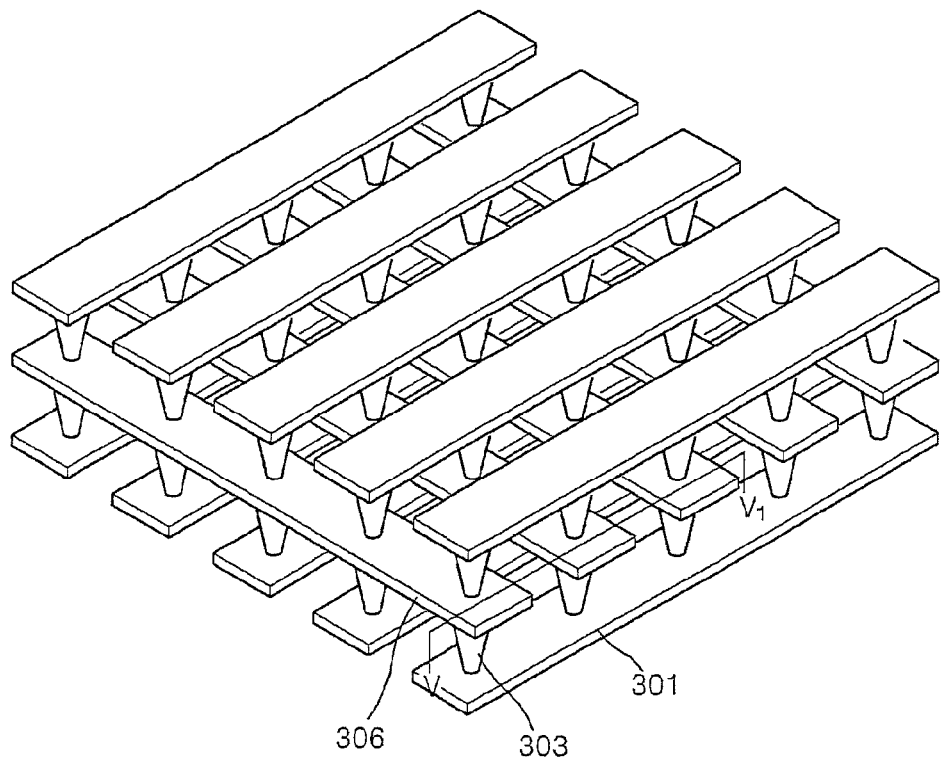
FIG. 1 is a perspective view of a cross point memory array according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. Embodiments may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the embodiments described herein. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the example embodiments are merely described below, by referring to the figures, to explain aspects of the present description.

Figure 2:
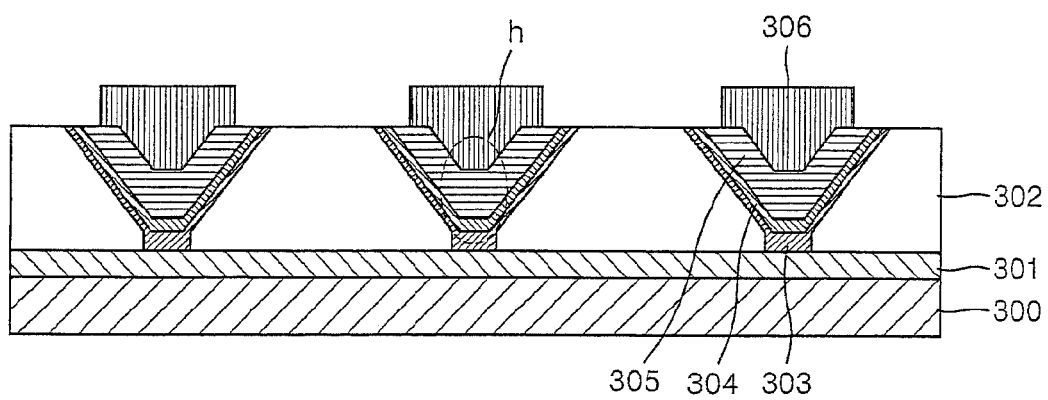
FIG. 2 is a cross-sectional view of the cross point memory array of FIG. 1, taken along line V-V1.

FIG. 1 is a perspective view of a cross point memory array according to an example embodiment. FIG. 2 is a cross-sectional view of the cross point memory array of FIG. 1, taken along line V-V1.

Referring to the example embodiment shown in FIGS. 1 and 2, a plurality of bottom electrodes 301 are formed on a substrate 300. The bottom electrodes 301 are formed to be in parallel with one another. A plurality of top electrodes 306 are formed to cross the bottom electrodes 301, and to be in parallel with one another. A storage node is formed at each cross point between the bottom electrodes 301 and the top electrodes 306. The storage node includes, inter alia, a memory resistor 303.

An insulating layer 302 is interposed between the bottom electrodes 301 and the top electrodes 306. A hole h is formed through the insulating layer 302 at each point where the bottom electrodes 301 and the top electrodes 306 cross one another. The bottom of each hole h exposes a portion of the surface of a corresponding bottom electrode 301. The holes h may have various shapes such as a cone shape, a cylindrical shape, a pyramidal shape, an asymmetrically polygonal shape, etc.

As shown in FIGS. 1 and 2, the memory resistor 303, an intermediate electrode 304, and a switch structure 305 are formed sequentially as layers in each hole h. For example, the memory resistor 303 may be formed as a layer on the bottom and the sidewall of the holes h through the insulating layer 302. The intermediate electrode 304 and the switch structure 305 are formed sequentially on the memory resistor 303. The top electrode 306 is formed on the switch structure 305.

The substrate 300 may be a silicon (Si) substrate used in a general semiconductor device or an insulating substrate made of glass or plastic.

The bottom electrode 301, the intermediate electrode 304, and the top electrode 306 may be formed of an electrode material such as aluminum (Al), hafnium (Hf), zirconium (Zr), zinc (Zn), tungsten (W), cobalt (Co), gold (Au), platinum (Pt), ruthenium (Ru), iridium (Ir), titanium (Ti), or a conductive metal oxide.

The insulating layer 302 may be formed of an insulating material that reduces and/or prevents the transmission of current. For example, the insulating layer 302 may be silicon dioxide ($SiO_2$), silicon nitride ($Si_3N_4$), aluminum oxide ($Al_2O_3$), etc.

The memory resistor 303 may be formed of a variable resistance material that is used in a variable resistance memory devices in which the storage and erasure of information is performed by varying resistance. The memory resistor 303 may be formed of a unipolar material in which the storage and erasure of information is performed by applying pulse voltages in one direction. That is, for example, the memory resistor 303 may be formed of a unipolar material in which the storage and erasure of information is performed by applying pulse voltages having the same polarity. The unipolar material may be, for example, a transition metal oxide material such as nitrogen (Ni) oxide, titanium (Ti) oxide, hafnium (Hf) oxide, zirconium (Zr) oxide, zinc (Zn) oxide, tungsten (W) oxide, cobalt (Co) oxide, copper (Cu) oxide, niobium (Nb) oxide, or a material including at least one selected from the group including: Ni oxide, Ti oxide, Hf oxide, Zr oxide, Zn oxide, W oxide, Co oxide, Cu oxide, and Nb oxide. According to at least some example embodiments, the transition metal oxide material may be nickel oxide (NiO), titanium dioxide ($TiO_2$), hafnium oxide (HfO), zirconium oxide (ZrO), zinc oxide (ZnO), tungsten trioxide ($WO_3$), cobalt oxide (CoO), copper oxide (CuO), $Nb_2O_5$, or a compound including at least one selected from the group including: NiO, $TiO_2$, HfO, ZrO, ZnO, $WO_3$, CoO, CuO, and $Nb_2O_5$.

The switch structure 305 may be formed as a non-ohmic structure such as a diode, a Zener diode, a varistor, or a threshold voltage switching element. In other words, the switch structure 305 may be an oxide diode having a multi- or bi-layer structure of an n-type oxide semiconductor layer and a p-type oxide semiconductor layer.

When the switch structure 305 is a diode, the switch structure 305 controls the direction of current that flows through the memory resistor 303. The switch structure 305 allows current to flow through the memory resistor 303 in one direction, but controls the flow of current in another direction to reduce and/or prevent leakage current that may occur in a cross point array structure.

Figure 3:
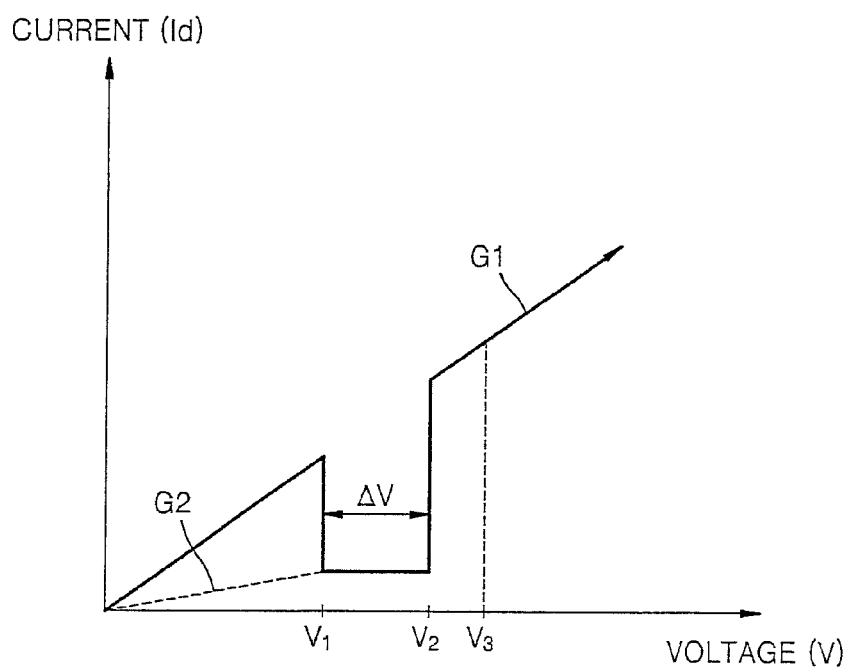
FIG. 3 is a graph showing example current versus voltage (I-V) characteristics of a resistance material of a memory resistor of the cross point memory array shown in FIG. 1.

Example operating characteristics of a memory resistor 303 formed of a unipolar material are shown in the current versus voltage (I-V) graph of FIG. 3.

FIG. 3 is a graph showing example I-V characteristics of a resistance material of the memory resistor 303 of the cross point memory array shown in FIG. 1.

Referring to FIG. 3, if the sizes of voltages to be applied to the bottom electrode 301 and the top electrode 306 are increased gradually from about 0 V, currents increase in proportion to the voltages along a graph G1. However, if a voltage equal to about V1 is applied to the bottom electrode 301 and the top electrode 306, the resistance of the memory resistor 303 increases substantially, and current is reduced. If a voltage in the range of between about V1 and about V2 is applied to the bottom electrode 301 and the top electrode 306, current that flows through the memory resistor 303 increases along graph G2. If a voltage greater than or equal to about voltage V2 (V2>V1) is applied to the bottom electrode 301 and the top electrode 306, the resistance of the memory resistor 303 is suddenly reduced, and current increases along graph G1.

In a general resistive memory device, a reset current that varies from graph G1 indicative of a low resistance state (LRS) to graph G2 indicative of a high resistance state (HRS) (e.g., current at voltage V1 shown in the graph G1) is reduced as the size of unit cells is reduced. The reset current may be reduced by reducing the size of the unit cells to reduce power consumption of the cross point memory array and/or to improve the integration degree of the cross point memory array.

Meanwhile, the characteristic of current that flows through the storage node is controlled by the switch structure 305. When the switch structure 305 such as a diode is used, the size of current applied to the storage node is related to the area of the switch structure 305. In other words, when relatively large current is used to set or reset the storage node, the size of current may be reduced by increasing the size of the switch structure 305 formed between the top electrode 306 and the intermediate electrode 304. In this case, referring back to FIG. 2, the area of the memory resistor 303 is similar or substantially similar to the area of the switch structure 305, but the area of the memory resistor 303 that contacts the bottom electrode 301 is limited by the insulating layer 302. Thus, the effective area of the memory resistor 303 that acts as the storage node corresponds to the exposed area of the insulating layer 302.

Figure 4:
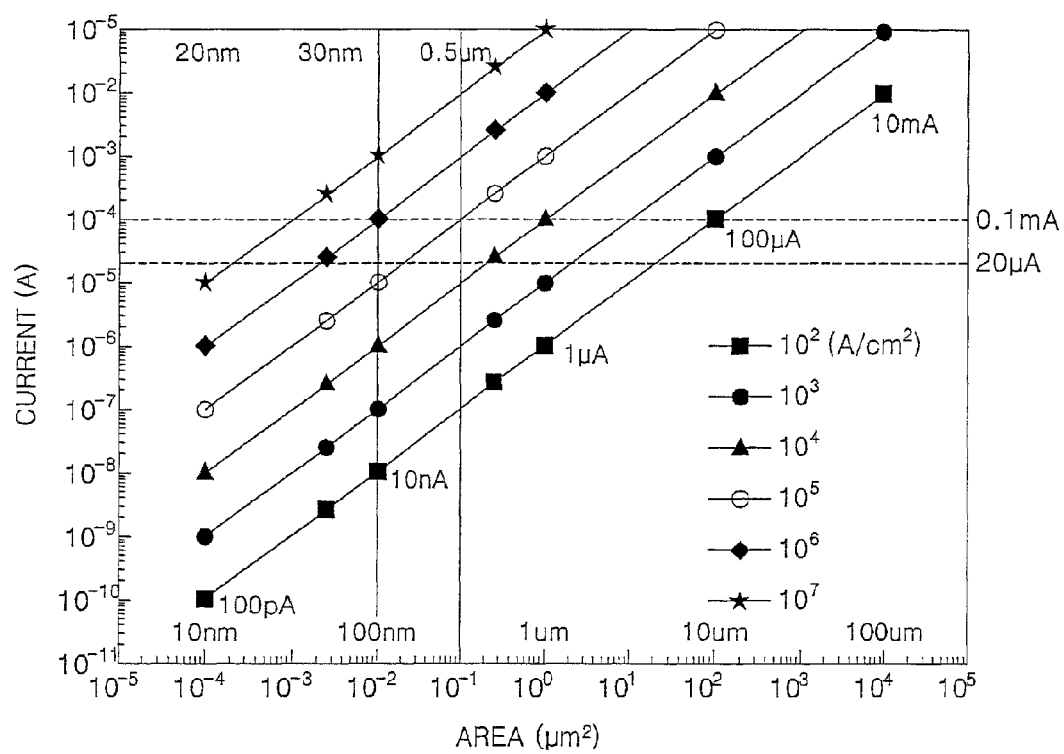
FIG. 4 is a graph showing an example area of a switch structure versus current to be supplied to the cross point memory array at different current densities.

FIG. 4 is a graph showing an example area of a switch structure versus current to be supplied to the cross point memory array at different current densities.

Referring to FIG. 4, in the case of a circular switch having an area of about $10^{-2}$ μm$^2$, assuming that the variable resistance material of a memory resistor is switched at a current of about $10^{-4}$A (0.1 mA), the current density is about 106 A/cm$^2$. This applies to a rectangular switch having opposite sides with a length of about 100 nm. However, when the switch structure 305 is formed as a three-dimensional (3D) structure in a corresponding hole h, the area of the switch structure 305 is increased (e.g., greatly or substantially increased). According to at least some example embodiments, the switch structure 305 is formed as a 3D structure. In this case, the area of the bottom of the switch structure 305 is about $10^{-2}$ μm$^2$, but the total area thereof is about $10^{-1}$ μm$^2$. As a result, a switching current of about $10^{-4}$A may flow at a current density of about 105 A/cm$^2$. That is, for example, the current density may be reduced by about 1/10 as compared to a switch having a 2D structure. Accordingly, in a resistive memory device according to at least this example embodiment, the switch structure 305 is formed as a 3D structure while the area of the storage node does not increase so that a more stable switching current with a relatively high integration degree may be maintained.

Thus, in cross point memory arrays, an electric potential for driving the storage node is applied to the bottom area of the intermediate electrode 304 in which the memory resistor 303 contacts the intermediate electrode 304. Thus, the aspect ratio (AR) of the hole h of the insulating layer 302 is controlled to improve the integration degree of the cross point memory. array. In addition, a contact side in which the switch structure 305 and the intermediate electrode 304 contact each other is formed as a 3D structure, and the size of the contact side is larger (e.g., substantially larger) than the cross-sectional area of the hole h so that the current density for switching the resistive memory device may be improved.

Hereinafter, methods of manufacturing cross point memory arrays according to example embodiments will be described in detail with reference to FIGS. 5A through 5F and FIGS. 6A through 6G.

FIGS. 5A through 5F illustrate a method of manufacturing a cross point memory array such as the cross point memory array shown in FIG. 1 according to an example embodiment.

Figure 5A:
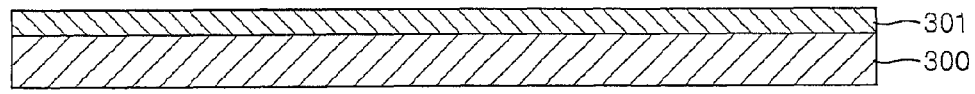
FIGS. 5A through 5F illustrate a method of manufacturing the cross point memory array shown in FIG. 1 according to an example embodiment.

Referring to FIG. 5A, an electrode material is coated on the substrate 300 and patterned to form the bottom electrode 301. The electrode material may be Al, Hf, Zr, Zn, W, Co, Au, Pt, Ru, Ir, Ti, or conductive metal oxide such as indium zinc oxide (IZO) or indium tin oxide (ITO).

Figure 5B:
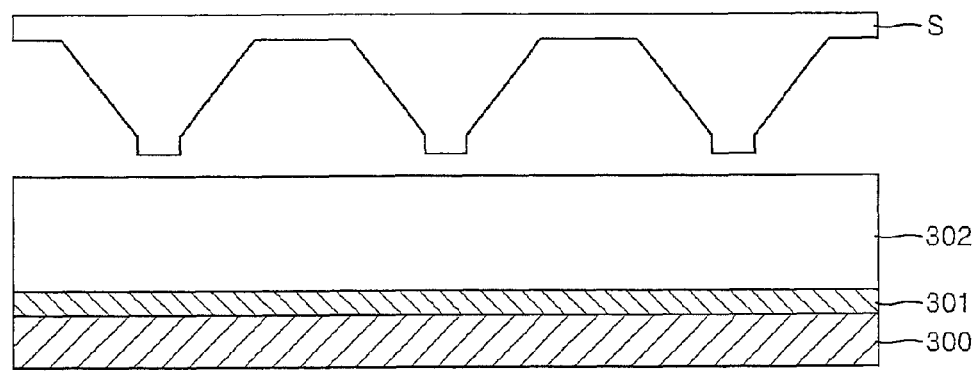

Referring to FIG. 5B, an insulating material 302 may be coated on the bottom electrode 301 using a method of forming a thin film such as spin coating, dispensing, spray coating, etc. A nano-imprint process is performed using a stamp S in which a solid shape such as a circular cylinder shape, a cone shape, or a pyramidal shape is formed, thereby forming patterns defining the holes h. As shown in FIG. 5B, the holes h have a shape inverse to the shape of the stamp S at positions on the bottom electrode 301.

After the nano-imprint process is performed, additional processes, such as an ashing or a similar process, may be performed to expose the bottom electrode 301.

Figure 5C:
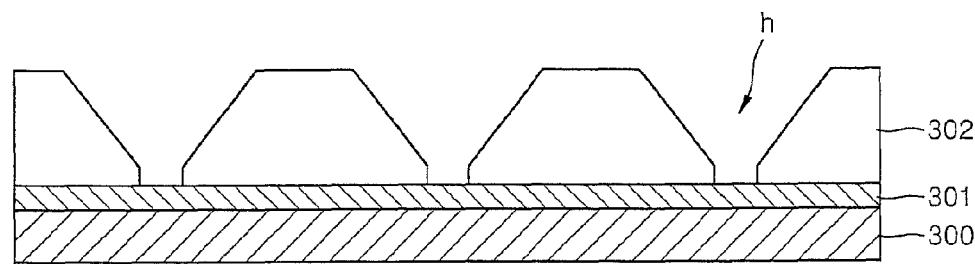

FIG. 5C is a cross-sectional view of a structure in which the patterns are formed as the insulating layer 302 after performing the nano-imprint process.

Referring to FIG. 5C, an organic material or an inorganic material having sufficient (e.g., excellent) insulating properties, such as hydrogen silsesquioxane (HSQ) or photocurable epoxy silane resin (PES), may be used as an insulating material formed on the bottom electrode 301 to reduce and/or prevent leakage current and/or a short circuit between the resistance bodies 303 in which information is stored.

The stamp S used in the nano-imprint process may be manufactured using a master that is manufactured with various materials such as Si, polymer, metal, quartz, etc. For example, the stamp S may be manufactured by copying patterns by coating polymer on the master, or by copying patterns in the form of metal by plating, or by performing a process such as an etching process after the patterns are transferred onto a quartz, glass, or another Si wafer by using the master and polymer.

Figure 5D:
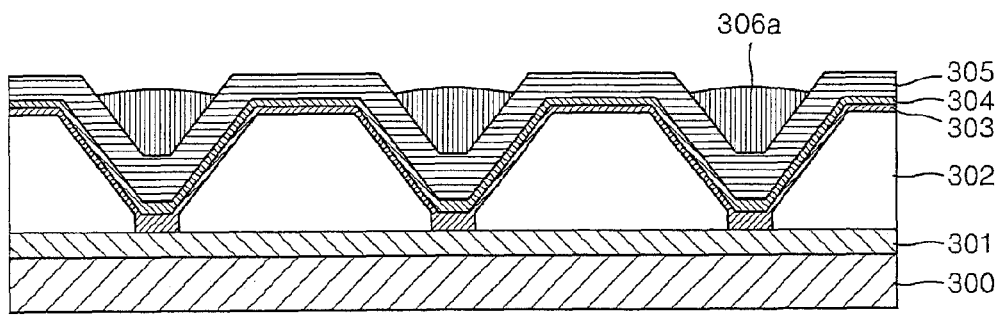

Referring to FIG. 5D, after performing the nano-imprint process a variable resistance material is coated in the hole h to form the memory resistor 303. The memory resistor 303 may be formed of a unipolar material in which the storage and erasure of information is performed by applying pulse voltages in one direction (e.g., by applying voltages having the same polarity). The unipolar material may be, for example, a transition metal oxide material such as Ni oxide, Ti oxide, Hf oxide, Zr oxide, Zn oxide, W oxide, Co oxide, Cu oxide, Nb oxide, or a material including at least one selected from the group including: Ni oxide, Ti oxide, Hf oxide, Zr oxide, Zn oxide, W oxide, Co oxide, Cu oxide, and Nb oxide.

After the memory resistor 303 is formed, Al, Hf, Zr, Zn, W, Co, Au, Pt, Ru, Ir, Ti, or a conductive metal oxide is coated on the memory resistor 303 to form the intermediate electrode 304. A switching material layer (e.g., the switch structure 305) is formed on the intermediate electrode 304, and then the hole h is filled with a top electrode material 306a. When an oxide diode is used as the switch structure 305, the switch structure 305 may be formed with an n-type oxide semiconductor layer and a p-type semiconductor layer. In this case, the order of stacking the n-type oxide semiconductor layer and the p-type oxide semiconductor layer may be reversed. Zn oxide or InZn oxide may be used to form the n-type oxide semiconductor layer, and Cu oxide may be used to form the p-type oxide semiconductor layer.

Figure 5E:
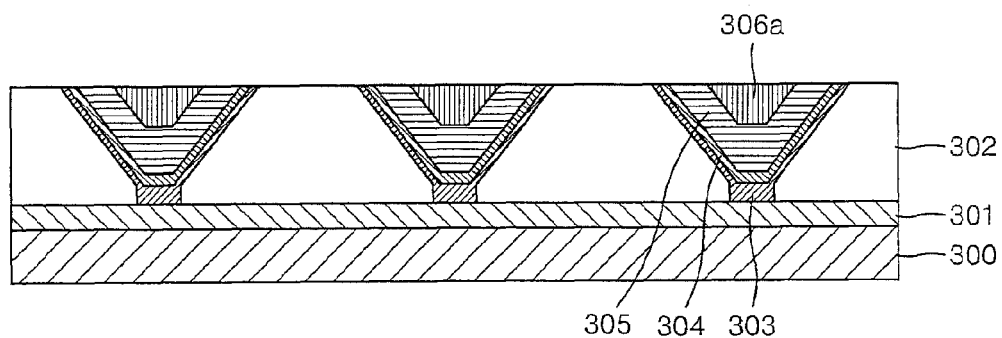

Referring to FIG. 5E, after depositing the memory resistor 303, the intermediate electrode 304, the switch structure 305, and the top electrode material 306a that fills the hole h, a planarization process is performed to remove an upper portion of the material layers of the memory resistor 303, the intermediate electrode 304, the switch structure 305, and the top electrode material 306a, which are formed in areas other than the holes h.

Figure 5F:
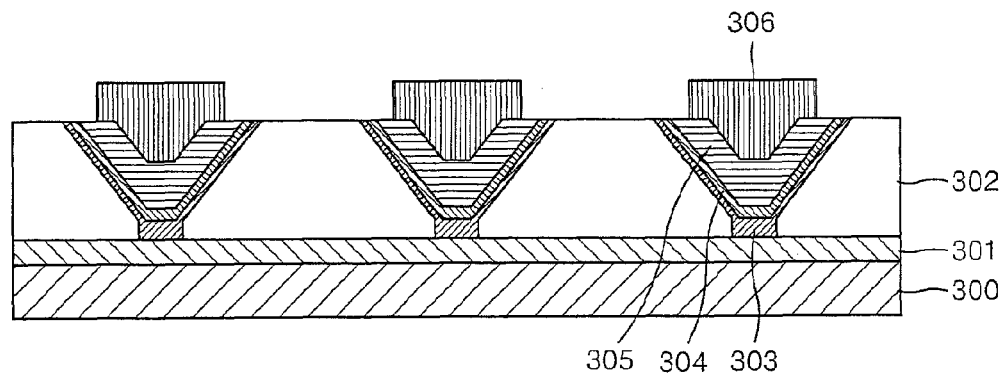

Referring to FIG. 5F, an electrode material is coated on the area in which the hole h is formed. The electrode material is patterned to form the top electrodes 306, thereby forming a cross point memory array.

FIGS. 6A through 6G illustrate a method of manufacturing a cross point memory array such as the cross point memory array shown in FIG. 1 according to another example embodiment.

Figure 6A:
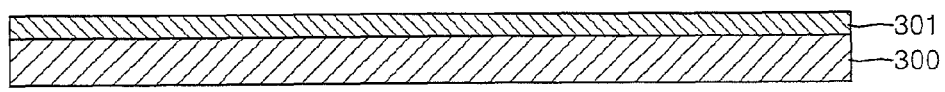
FIGS. 6A through 6G illustrate a method of manufacturing the cross point memory array shown in FIG. 1 according to another example embodiment.

Referring to FIG. 6A, an electrode material is coated on the substrate 300 and patterned to form the bottom electrode 301. A metal or conductive metal oxide may be used as the electrode material.

Figure 6B:
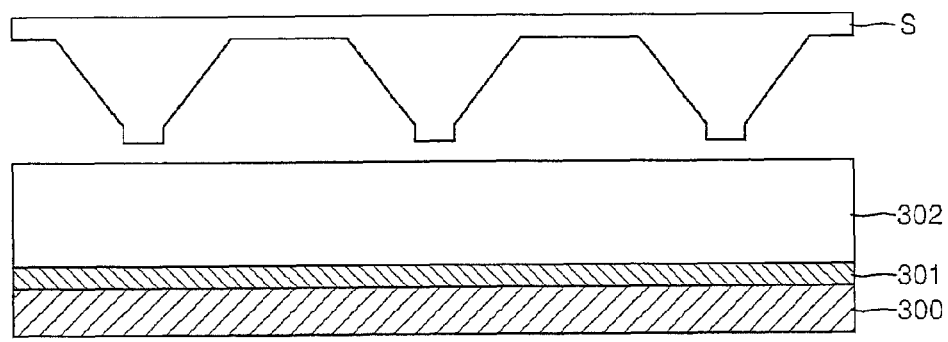
Figure 6C:
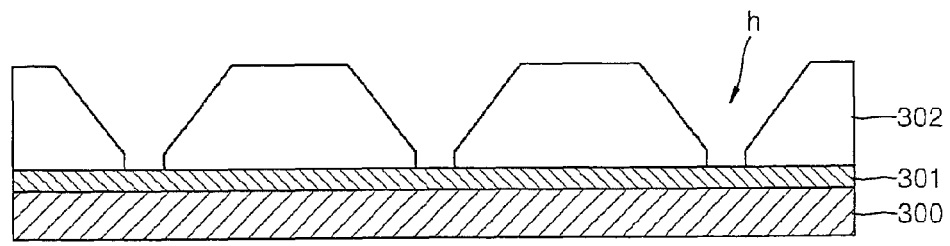

Referring to FIGS. 6B and 6C, an insulating material is coated on the bottom electrode 301. The insulating material may be coated using a method of forming a thin film, such as spin coating, dispensing, spray coating, etc. A nano-imprint process is performed using a stamp S in which a solid shape such as a circular cylinder shape, a cone shape, or a pyramidal shape is formed, thereby forming patterns having a shape inverse to the shape of the stamp S at positions on the bottom electrode 301. After performing the nano-imprint process, additional processes, such as an ashing or similar process, may be performed to expose the bottom electrode 301. When the nano-imprint process is performed, the insulating layer 302 has a structure in which the patterns having a shape inverse to the shape of the stamp S and defining holes h are formed.

Figure 6D:
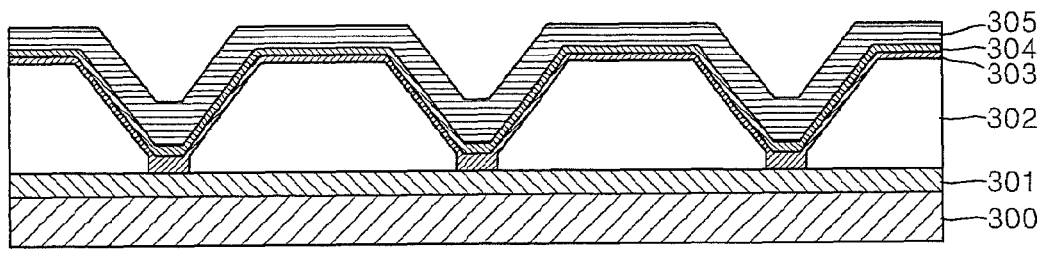

Referring to FIG. 6D, a variable resistance material is coated in the holes h to form the memory resistor 303. The memory resistor 303 may be formed of a unipolar material in which the storage and erasure of information is performed by applying pulse voltages in one direction (e.g., pulse voltages having the same polarity). The unipolar material may be a transition metal oxide material. After the memory resistor 303 is formed, a metal or conductive metal oxide is coated on the memory resistor 303 to form the intermediate electrode 304. A switching material layer is deposited on the intermediate electrode 304 and patterned to form the switch structure 305 on the intermediate electrode 304. When an oxide diode is used as the switch structure 305, the switch structure 305 may be formed with an n-type oxide semiconductor layer and a p-type semiconductor layer. In this example, the order of stacking the n-type oxide semiconductor layer and the p-type oxide semiconductor layer may be reversed.

Figure 6E:
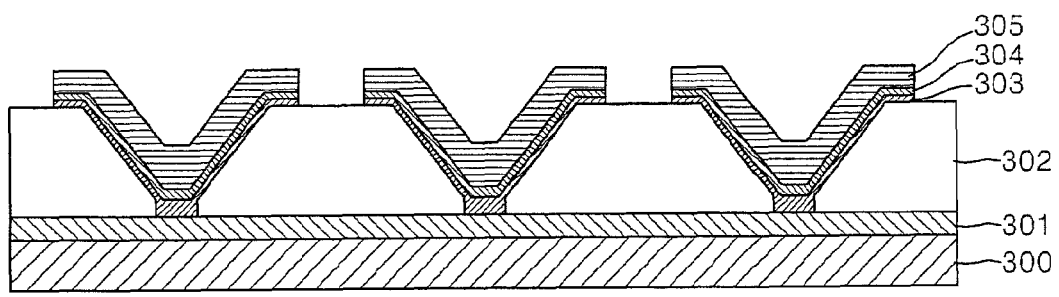

Referring to FIG. 6E, portions of material layers of the memory resistor 303, the intermediate electrode 304, and the switch structure 305, which are formed between the holes h (e.g., between unit cells) are etched by performing an etching process such as dry etching. Thus, portions of the insulating layer 302 may be exposed. According to at least the example embodiment shown in FIG. 6E, the material layers between the unit cells are removed by performing a planarization process; however the material layers between the unit cells may also be removed by performing an etching process.

Figure 6F:
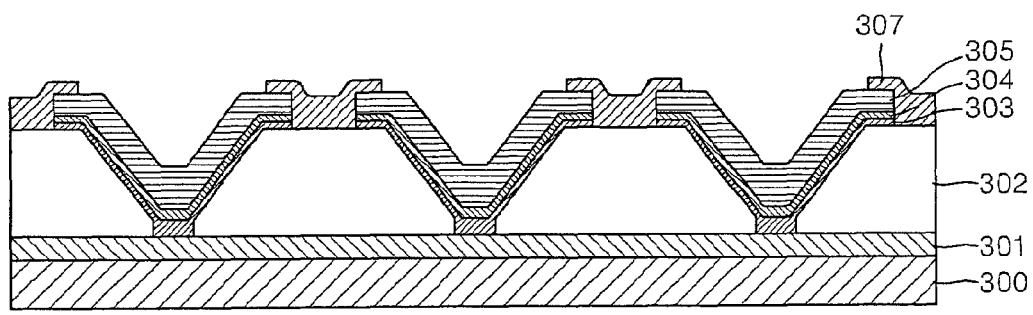
Figure 6G:
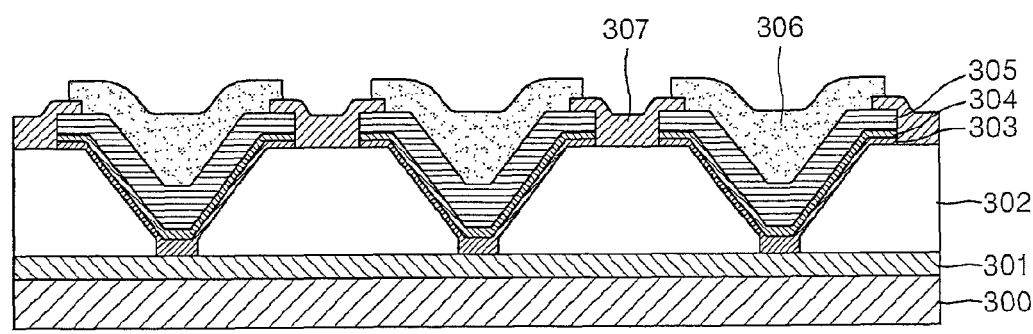

Referring to FIGS. 6F and 6G, an insulating material, such as Si oxide or Si nitride, is coated on the exposed areas between the holes h (e.g., on the exposed insulating layer 302) to form a passivation layer 307.

Referring to FIG. 6G, an electrode material is coated on the switch structure 305 and is patterned to form the top electrodes 306.

As described above, when the hole h is formed using a nano-imprint process, the memory resistor 303, the intermediate electrode 304, and the switch structure 305 are formed in the hole h. As a result, the number of etching processes may be reduced, and damage to the cross point memory array due to etching may also be reduced. In addition, the efficiency of a method of manufacturing cross point memory arrays may be improved.

Hereinafter, a master for an imprint process, which may be used to manufacture the stamp S shown in FIG. 5B or 6B, and a method of manufacturing the master will be described in more detail.

Figure 7:
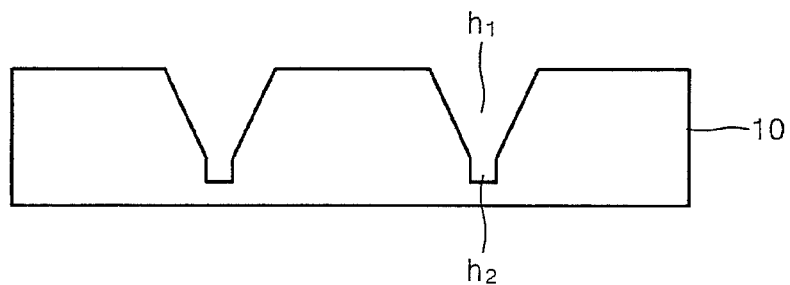
FIG. 7 illustrates a master for an imprint process according to an example embodiment.

FIG. 7 illustrates a master for an imprint process according to an example embodiment.

Referring to FIG. 7, a master 10 according to at least this example embodiment includes a 3D pattern having first type patterns h1 and second type patterns h2. In FIG. 7, an inclination pattern is used as a first type pattern h1, and a vertical pattern is used as a second type pattern h2; however each of the first type patterns h1 and the second type patterns h2 may be an inclination pattern, a vertical pattern, a rounded pattern, etc. As shown in FIG. 7, the widths of the first type pattern h1 and the second type pattern h2 are different. For example, the master 10 may have various shapes such as a shape including the rounded pattern and the inclination pattern, a shape including the rounded pattern and the vertical pattern, and a shape including the rounded pattern, the inclination pattern, and the vertical pattern. Alternatively, the master 10 may also have a circular cylindrical shape, a cone shape, and a pyramidal shape.

The master 10 according to at least the example embodiment shown in FIG. 7 is a multi-layered substrate formed of a plurality of materials. Each of the plurality of layers may have different patterns. For example, the substrate may include a first layer, a second layer, and a third layer, where the second layer and the third layer are sequentially formed on the first layer of the substrate. The first type pattern is formed in the third layer, and the second type pattern is formed in the second layer. In this case, the first type pattern and the second type pattern may be an inclination pattern, a vertical pattern, a rounded pattern, etc. In addition, different patterns may be formed in a layer to form the master 10.

Hereinafter, methods of manufacturing a master for an imprint process according to an example embodiment will be described in more detail with reference to FIGS. 8A through 8E, FIGS. 9A through 9E, and FIGS. 10A through 10E.

According to at least some example embodiments, in a method of manufacturing a master for the imprint process, a substrate is prepared and a mask layer exposing a portion of a surface of the substrate is formed. A first type pattern is formed by performing a first etching process on the exposed surface of the substrate. A second type pattern is formed in the substrate by performing a second etching process.

FIGS. 8A through 8E illustrate a method of manufacturing the master 10 shown in FIG. 7 according to an example embodiment.

Figure 8A:
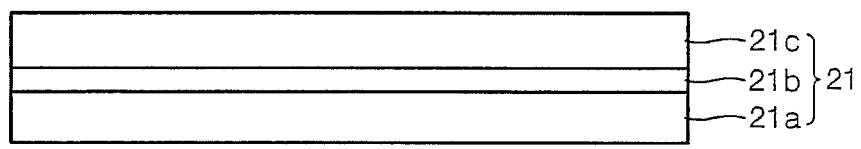
FIGS. 8A through BE illustrate a method of manufacturing the master shown in FIG. 7 according to an example embodiment.

Referring to FIG. 8A, a multi-layer substrate 21 is prepared. The substrate 21 includes a first layer 21a, a second layer 21b, and a third layer 21c. The first layer 21a may be formed of silicon, glass, or other semiconductor materials. The second layer 21b may be formed of silicon oxide or nitride. The third layer 21c may be formed of silicon.

Figure 8B:
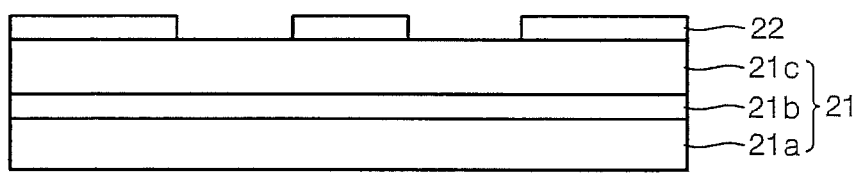

Referring to FIG. 8B, a mask layer 22 is formed on the third layer 21c. According to at least this example embodiment, the mask layer 22 is formed of silicon nitride or silicon oxide on the third layer 21c. The mask layer 22 is then patterned to expose portions of the third layer 21c.

Figure 8C:
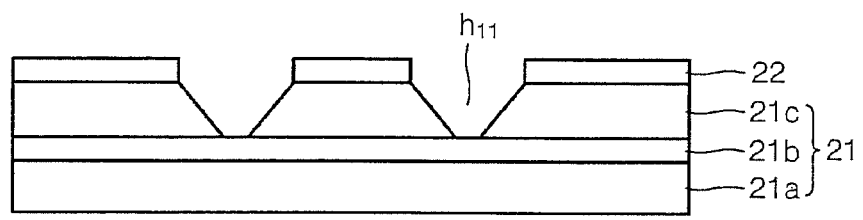

Referring to FIG. 8C, an etching process is performed on the exposed third layer 21c. In this example embodiment, various etching methods may be used. In one more specific example, an anisotropic wet etching process may be performed to form inclination patterns h11. The etching process is performed on the third layer 21c until the second layer 21b, which functions as an etching stop layer, is exposed.

When the third layer 21c is formed of Si (100), a potassium hydroxide (KOH) or teramethylammonium hydroxide (TMAH) solution may be used to perform inclination etching, which will be described in more detail below.

Initially, in one example embodiment, a natural oxide layer is removed from the Si (100) using a solution in which a hydrofluoric (HF) solution is diluted with deionized (DI) water at about 1:6 to about 1:10 vol %, inclusive. Anisotropic etching of Si (100) is then selectively performed using the KOH or TMAH solution. The TMAH solution may be diluted with the DI water at about 20 wt %, and an etching process is performed in a bath of about 70° C. The etching speed in this case is about 400 nm/min. Thus, the inclination etching of Si (100) may be performed at an inclination of about 54.7°. When the third layer 21c is formed of other material than Si (100), an etching material and an etching method may be selected according to substrate materials.

Figure 8D:
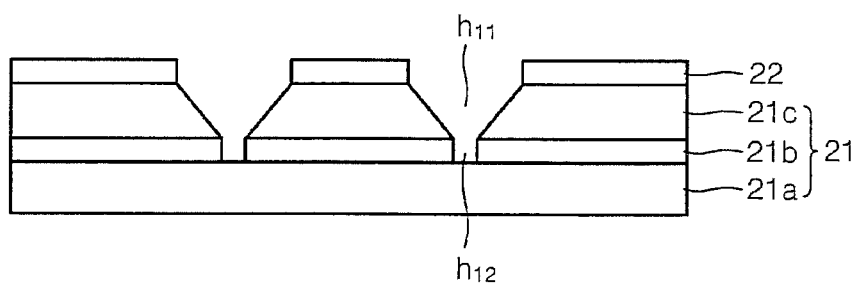

Referring to FIG. 8D, an etching process such as dry etching or wet etching is performed on the exposed second layer 21b until portions of the first layer 21a are exposed to form vertical patterns h12. For example, when the second layer 21b is formed of silicon oxide or silicon nitride, the following etching method may be performed.

When the second layer 21b is formed of silicon oxide, dry etching may be performed as a reaction ion etching (RIE) process using a C—F-based gas such as $CF_4$, $C_2F_5$, or $C_3F_8$. On the other hand, when the second layer 21b is formed of silicon nitride, a dry etching process using $CF_4/CHF_3$ may be performed.

Figure 8E:
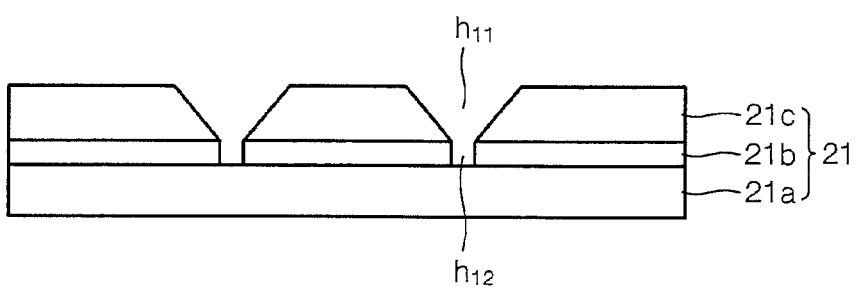

Referring to FIG. 8E, when the mask layer 22 is removed from the substrate 21, the manufacture of the master 10 for an imprint process, including the inclination patterns h11 and the vertical patterns h12 formed in the substrate 21, is complete.

FIGS. 9A through 9E illustrate a method of manufacturing a master for an imprint process according to another example embodiment.

Figure 9A:
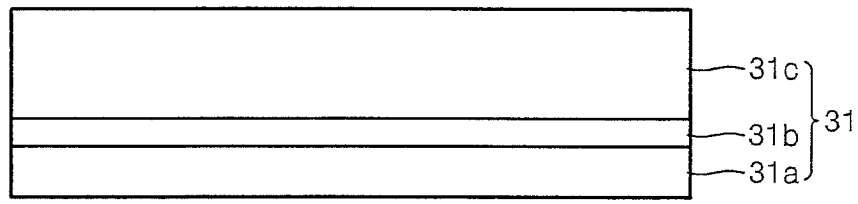
FIGS. 9A through 9E illustrate a method of manufacturing a master for an imprint process according to another example embodiment.

Referring to FIG. 9A, initially, a multi-layer substrate 31 is prepared. According to at least this example embodiment, the multi-layer substrate 31 includes a first layer 31a, a second layer 31b, and a third layer 31c. The first layer 31a may be formed of silicon, glass, or other semiconductor materials. The second layer 31b may be formed of silicon oxide or nitride. The third layer 31c may be formed of silicon.

Figure 9B:
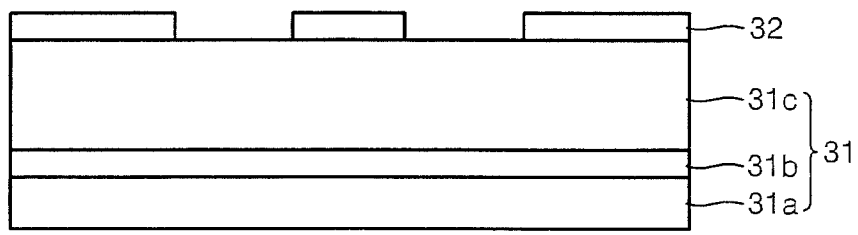

Referring to FIG. 9B, a mask layer 32 is formed on the third layer 31c. In this example, the mask layer 32 is formed of silicon nitride or silicon oxide on the third layer 31c and is then patterned to expose portions of the third layer 31c.

Figure 9C:
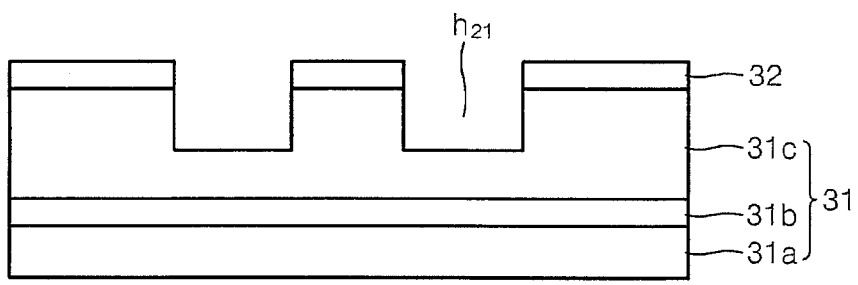

Referring to FIG. 9C, an etching process is performed on the exposed third layer 31c. In this example, vertical patterns h21 may be formed by a dry etching process. The etching process may be performed on the third layer 31c before the second layer 31b is exposed.

When the third layer 31c is formed of Si (100) and a dry etching process is performed using $Cl_2$, $CF_4$, or $CF_4/O_2$, the vertical patterns h21 are formed in the Si (100).

Figure 9D:
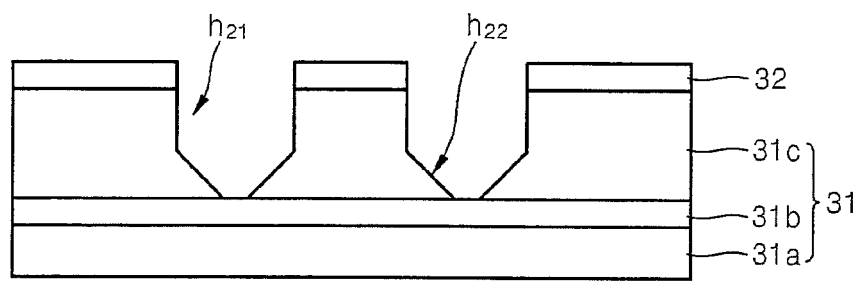

Referring to FIG. 9D, drying etching of a portion of the third layer 31c is performed in a vertical direction, and then wet etching thereof is performed to form inclination patterns h22. When the third layer 31c is formed of Si (100), in order to perform inclination etching, a wet etching process may be performed by using a KOH or TMAH solution. The inclination etching process may be performed until the second layer 31b is exposed.

Figure 9E:
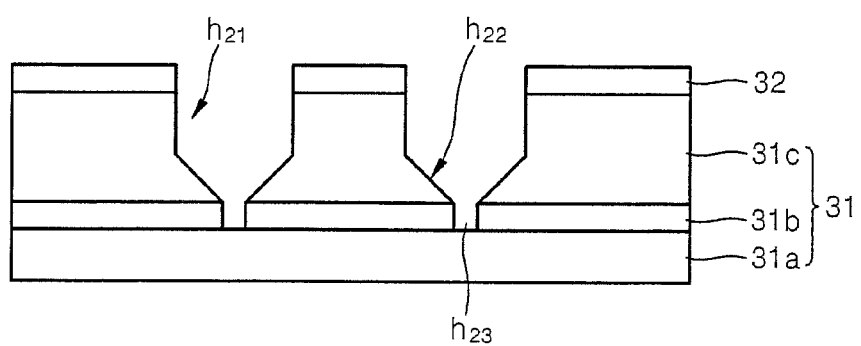

Referring to FIG. 9E, an etching process such as a dry etching process or a wet etching process is performed on the exposed second layer 31b to form vertical patterns h23. For example, when the second layer 31b is formed of silicon oxide, a C—F-based gas such as $CF_4$, $C_2F_5$, or $C_3F_8$ may be used. When the second layer 31b is formed of silicon nitride, a dry etching process using $CF_4/CHF_3$ may be used when the mask layer 32 is removed from the substrate 31. Accordingly, the manufacture of the master for an imprint process, including 3D patterns in which the vertical patterns h21, the inclination patterns h22 and the vertical patterns h23 are combined in the substrate 31, is complete.

FIGS. 10A through 10E illustrate a method of manufacturing a master for an imprint process according to yet another example embodiment.

Figure 10A:
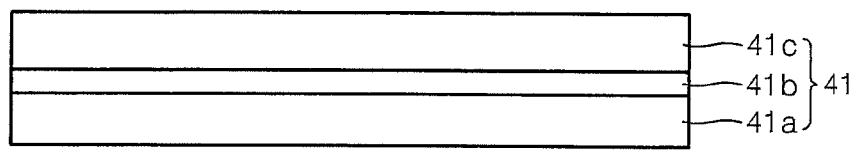
FIGS. 10A through 10E illustrate a method of manufacturing a master for an imprint process according to another example embodiment.

Referring to FIG. 10A, initially, a multi-layer substrate 41 is prepared. According to at least this example embodiment, the multi-layer substrate 41 includes a first layer 41a, a second layer 41b, and a third layer 41c. The first layer 41a may be formed of silicon, glass, or other semiconductor materials. The second layer 41b may be formed of silicon oxide or nitride, and the third layer 41c may be formed of silicon.

Figure 10B:
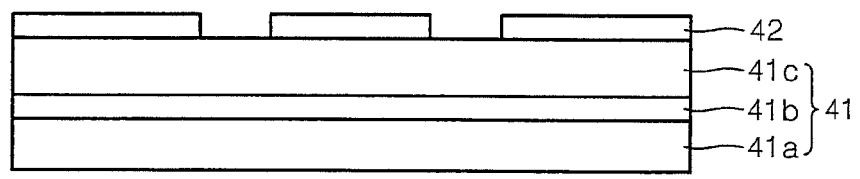

Referring to FIG. 10B, a mask layer 42 is formed on the third layer 41c. The mask layer 42 may be formed of silicon nitride or silicon oxide on the third layer 21c. The mask layer 42 is then patterned to expose portions of the third layer 41c.

Figure 10C:
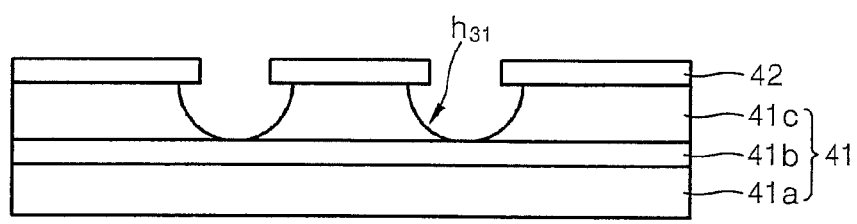

Referring to FIG. 10C, an etching process is performed on the exposed third layer 41c. As shown, FIG. 10C illustrates rounded patterns h31. When the third layer 41c is formed of silicon, a wet etching process using $HF/HNO_3/H_2O$ or $HF/HNO_3/CH_3COOH$ may be used to form the rounded patterns h31. In this case, an etching process is performed on the third layer 41c until the second layer 41b, which functions as an etching stop layer, is exposed.

Figure 10D:
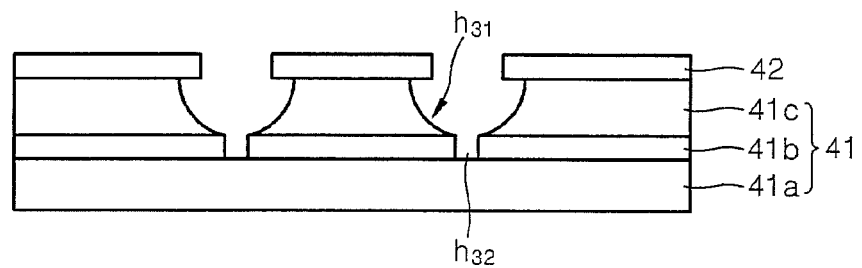

Referring to FIG. 10D, an etching process such as dry etching or wet etching is performed on the exposed second layer 41b to form vertical patterns h32. For example, when the second layer 41b is formed of silicon oxide, a C—F-based gas such as $CF_4$, $C_2F_5$, or $C_3F_8$ may be used in the etching process. When the second layer 41b is formed of silicon nitride, a dry etching process using $CF_4/CHF_3$ may be performed.

Figure 10E:
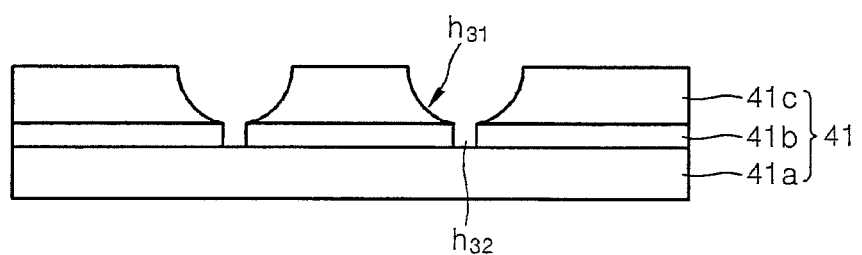

Referring to FIG. 10E, when the mask layer 42 is removed from the substrate 41, the manufacture of the master for an imprint process, including all of the rounded patterns h31 and the vertical patterns h32 formed in the substrate 41, is complete.

Figure 11:
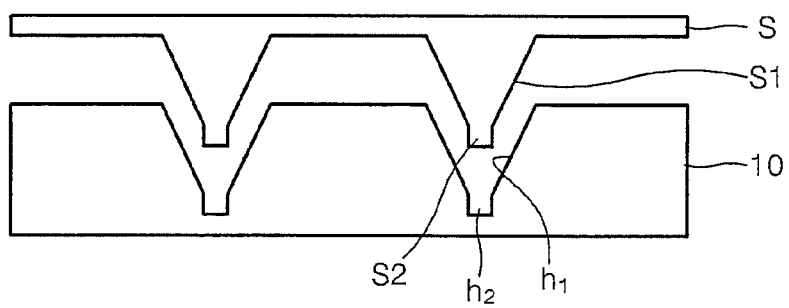
FIG. 11 illustrates an example stamp formed using the master shown in FIG. 7.

FIG. 11 illustrates an example embodiment of a stamp S formed using the master 10 shown in FIG. 7.

Referring to FIG. 11, the stamp S has an inverse shape to that of the master 10 for an imprint process. The stamp S may include inclination patterns S1 and protruded vertical patterns S2, which correspond to first and second type patterns h1 and h2 of the master 10. The stamp S used in the nano-imprint process may be manufactured by copying patterns using the master 10, and may also be manufactured by copying patterns by coating a mold resin or polymer on the master 10, or by copying patterns in the form of metal by plating, or by performing a process such as an etching process after the patterns are transferred onto a quartz, glass, or Si wafer by using the master and polymer. For example, the mold resin may be coated on the master 10, and ultra violet (UV) rays may be irradiated on the mold resin. Then, the mold resin may be cured and separated from the master 10 to form the stamp S. In this example embodiment, the mold resin may include a photo initiator so as to have an UV reaction with a functionalized prepolymer including an Acrylate Group. The mold resin may also include a releasing agent so as to be separated from the master 10 more easily.

A master for an imprint process, according to one or more of the above-described example embodiments, may be used to manufacture various devices. A stamp that is manufactured by using the master for the imprint process according to the one or more example embodiments may be used to manufacture a cross point memory array.

As described above, holes are formed in an insulating layer by performing a nano-imprint process using a stamp formed as a master having various patterns. A memory resistor, an intermediate electrode, and a switch structure that constitute a semiconductor device are formed in each of the holes. As a result, the number of etching processes may be reduced, and damage to the cross point memory array due to etching may be reduced. In addition, the efficiency of the method of manufacturing the cross point memory array may be improved.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A cross point memory array comprising:
    a plurality of bottom electrodes formed on a substrate to be parallel with one another;
    a plurality of top electrodes formed to cross the bottom electrodes and be in parallel with one another;
    an insulating layer interposed between the bottom electrodes and the top electrodes, the insulating layer having a hole formed at each point where the bottom electrodes and the top electrodes cross one another, each hole exposing a portion of a surface of the bottom electrodes; and
    a storage node including a memory resistor, an intermediate electrode layer, and a switching structure formed sequentially in each hole; wherein
        the memory resistor is formed on a bottom and a sidewall of each of the holes.

2. The cross point memory array of claim 1, wherein the memory resistor is composed of a material having two or more resistances according to the size of an applied pulse voltage.

3. The cross point memory array of claim 2, wherein the memory resistor is composed of a transition metal oxide material.

4. The cross point memory array of claim 3, wherein the transition metal oxide material includes nitrogen (Ni) oxide, titanium (Ti) oxide, hafnium (Hf) oxide, zirconium (Zr) oxide, zinc (Zn) oxide, tungsten (W) oxide, cobalt (Co) oxide, copper (Cu) oxide, niobium (Nb) oxide, or a material including at least one selected from the group including Ni oxide, Ti oxide, Hf oxide, Zr oxide, Zn oxide, W oxide, Co oxide, Cu oxide, and Nb oxide.

5. The cross point memory array of claim 1, wherein the switch structure includes a diode, a varistor, or a threshold voltage switching element.

6. The cross point memory array of claim 5, wherein the switch structure includes a diode having an n-type oxide semiconductor layer and a p-type oxide semiconductor layer.

* * * * *